(12) United States Patent
Tu et al.

(10) Patent No.: US 7,984,093 B1
(45) Date of Patent: Jul. 19, 2011

(54) POLYPHASE FILTER HAVING A TUNABLE NOTCH FOR IMAGE REJECTION

(75) Inventors: Cao-Thong Tu, Lausanne (CH); Frederic Declercq, Penthaz (CH)

(73) Assignee: Marvell International Ltd., Hamilton (BM)

( * ) Notice: Subject to any disclaimer, the term of this patent is extended or adjusted under 35 U.S.C. 154(b) by 1139 days.

(21) Appl. No.: 11/729,114

(22) Filed: Mar. 28, 2007

Related U.S. Application Data

(60) Provisional application No. 60/790,443, filed on Apr. 7, 2006.

(51) Int. Cl.
*G06G 7/02* (2006.01)
(52) U.S. Cl. .................................... 708/819
(58) Field of Classification Search .............. 708/819
See application file for complete search history.

(56) References Cited

U.S. PATENT DOCUMENTS

| 6,417,737 | B1 * | 7/2002 | Moloudi et al. | 330/301 |
| 6,441,682 | B1 * | 8/2002 | Vinn et al. | 327/552 |
| 7,139,547 | B2 * | 11/2006 | Wakayama et al. | 455/333 |
| 2005/0101281 | A1 * | 5/2005 | Schelmbauer | 455/323 |

FOREIGN PATENT DOCUMENTS

GB    1174710    12/1969

OTHER PUBLICATIONS

Farbod Behbahani, et al; "CMOS Mixers and Polyphase Filters for Large Image Rejection"; IEEE Journal of Solid-State Circuits, vol. 36, No. 6, Jun. 2001; pp. 873-887.

* cited by examiner

*Primary Examiner* — Chuong D Ngo

(57) ABSTRACT

A polyphase filter comprises an impedance network. The polyphase filter also comprises a first differential amplifier that includes first inverting and non-inverting inputs and first inverting and non-inverting outputs. The first inverting and non-inverting inputs communicate through the impedance network with a first phase and a shifted first phase of an input signal, respectively. A second differential amplifier of the polyphase filter includes second inverting and non-inverting inputs and second inverting and non-inverting outputs. The second inverting and non-inverting inputs communicate with a second phase and a shifted second phase of the input signal, respectively, through the impedance network. The second phase is offset from the first phase.

45 Claims, 13 Drawing Sheets

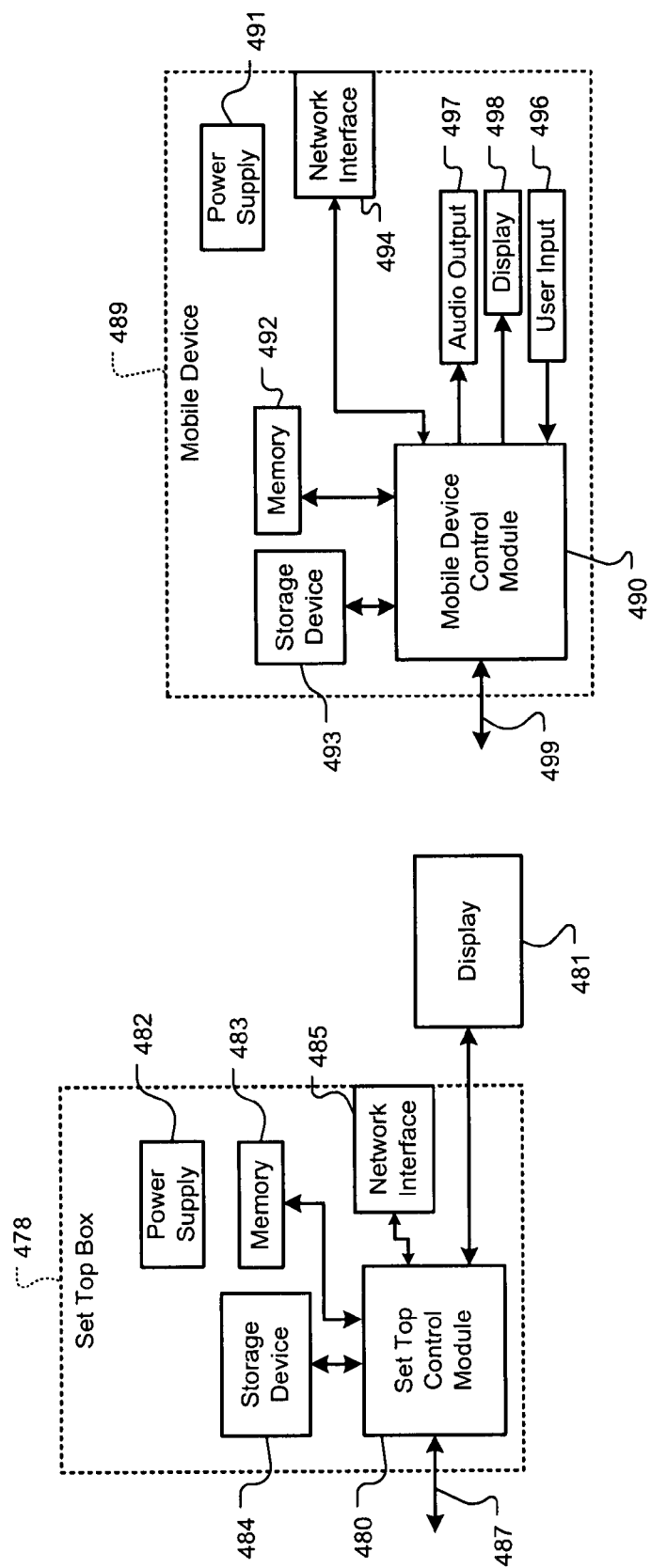

POLYPHASE FILTER HAVING A TUNABLE NOTCH FOR IMAGE REJECTION

CROSS-REFERENCE TO RELATED APPLICATIONS

This application claims the benefit of U.S. Provisional Application No. 60/790,443, filed on Apr. 7, 2006. The disclosure of the above application is incorporated herein by reference in its entirety.

FIELD

The present disclosure relates generally to filters, and more particularly, to polyphase filters.

BACKGROUND

The Background description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present disclosure.

Referring now to FIG. 1, typical mixers 10, 12 mix an incoming radio frequency ("RF") signal with orthogonal local signals generated by a local oscillator ("LO") 14. The mixers 10, 12 may receive LO signals through amplifiers 16, 18. Based on the LO signals, the mixers 10, 12 convert the RF signal into polyphase intermediate-frequency signals.

The polyphase signals may include quarter cycle segments, such as in-phase segments (I), quadrature segments (Q), inverse-phase segments (–I), and inverse-quadrature segments (–Q). Four phase signals I, Q, –I, and –Q may have the same amplitude but different adjacent phases of 0, 90, 180 and 270 degrees, respectively. The polyphase filter 20 may reject image signals of the RF input in favor of target signals.

When disturbances, such as image signals, are received in the polyphase filter 20 at a particular frequency, the polyphase filter 20 may act as a notch filter and may, for example, attenuate gain at that frequency. A notch filter blocks a narrow band of frequencies and passes all frequencies above and below the band. Notch frequency, bandwidth and depth characteristics may be controlled.

Referring now to FIGS. 2A and 2B, a passive polyphase filter may be composed of a four phase resistance and capacitance (RC) network 30 or impedance network with inputs ($V_{Iin}+$, $V_{Qin}+$, $V_{Iin}-$, $V_{Qin}-$) and outputs ($V_{Iout}+$, $V_{Qout}+$, $V_{Iout}-$, $V_{Qout}-$) disposed in the four relative phases, I, Q, –I, –Q. The four phase RC network 30 includes a resistance R in each of the four phases, which is connected between the input and output terminals 32, 34 of the associated phase. The input of each phase is connected to the output of an adjacent leading phase via a capacitance C. The RC network 30 may be represented by an asymmetrical frequency domain transfer function:

$$\frac{V_{Iout}}{V_{Iin}} = \frac{1+\omega RC}{1+j\omega RC} \quad \text{(Equation 1)}$$

such that when ω (angular frequency) equals 1/RC, $V_{Iout}$ equals $V_{Iin}(1-j)$, and when ω equals –1/RC, $V_{Iout}$ equals zero. Controlling notch characteristics of the RC network 30 may be realized by replacing conventional resistances with relatively large switched resistances arrays 35, which may cause distortion. Further, the network transfer function generally does not exhibit substantial low-pass filter functions.

Referring now to FIG. 3, a frequency response of the passive polyphase filter of FIG. 2A is illustrated. In FIG. 3, graph 42 of the positive frequency response represents the characteristics when a target signal is input. Graph 44 of the negative frequency response represents the characteristics when an image signal (image rejection characteristic) is input, including a notch characteristic 46 at 1/(2πRC). The polyphase filter may reject part of the negative frequencies while passing the positive frequencies. Further, the polyphase filter may fully reject an input sequence at the RC frequency.

Referring now to FIGS. 4A and 4B, several stages of polyphase filters 50, 52, 54 may be cascaded for image rejection across a wide band. Therefore, the circuits 56, 58 before and after the polyphase filters 50, 52, 54 are usually amplifiers. However, these amplifiers may add system noise. For multistage polyphase filtering, signal strength loss may accumulate, which necessitates interstage amplifiers 60.

In FIG. 5, a typical receiver 70 may include mixers 82, with both LO and RF input circuits 90, 92, respectively applied in quadrature. The outputs of the mixers 82 are combined following processing in amplifiers 93 and polyphase filter 94.

SUMMARY

A polyphase filter comprises an impedance network. The polyphase filter also comprises a first differential amplifier that includes first inverting and non-inverting inputs and first inverting and non-inverting outputs. The first inverting and non-inverting inputs communicate through the impedance network with a first phase and a shifted first phase of an input signal, respectively. A second differential amplifier includes second inverting and non-inverting inputs and second inverting and non-inverting outputs. The second inverting and non-inverting inputs communicate with a second phase and a shifted second phase of the input signal, respectively, through the impedance network. The second phase is offset from the first phase.

In other features, the first phase of the input signal defines in-phase (I) signals, and the shifted first phase of the input signal defines inverse in-phase (–I) signals. The second input phase of the input signal defines quadrature (Q) signals and the shifted second phase of the input signal defines inverse quadrature (–Q) signals.

In other features, the impedance network comprises a first impedance that has a first end that communicates with the first non-inverting input and a second end that communicates with the first inverting output. The impedance network also comprises a second impedance that has a first end that communicates with the first non-inverting input and a second end that communicates with the shifted second phase of the input signal. The impedance network also comprises a third impedance that has a first end that communicates with the first non-inverting input and a second end that communicates with the first phase of the input signal.

In other features, the impedance network comprises a fourth impedance that has a first end that communicates with the first inverting input and a second end that communicates with the first non-inverting output. The impedance network also comprises a fifth impedance that has a first end that communicates with the first inverting input and a second end that communicates with the second phase of the input signal. The impedance network also comprises a sixth impedance that has a first end that communicates with the first inverting input and a second end that communicates with the first shifted phase of the input signal.

In other features, the impedance network comprises a seventh impedance that has a first end that communicates with the second non-inverting input and a second end that communicates with the second inverting output. The impedance network also comprises an eighth impedance that has a first end that communicates with the second non-inverting input and a second end that communicates with the first phase of the input signal. The impedance network also comprises a ninth impedance that has a first end that communicates with the second non-inverting input and a second end that communicates with the second phase of the input signal.

In other features, the impedance network comprises a tenth impedance that has a first end that communicates with the second inverting input and a second end that communicates with the second non-inverting output. The impedance network also comprises an eleventh impedance that has a first end that communicates with the second inverting input and a second end that communicates with the shifted first phase of the input signal. The impedance network also comprises a twelfth impedance that has a first end that communicates with the second inverting input and a second end that communicates with the shifted second phase of the input signal.

In other features, the first, fourth, seventh and tenth impedances each comprise a first resistance. The first resistance comprises a variable resistance. The first, fourth, seventh and tenth impedances each further comprise a capacitance in parallel with the first resistance. The capacitance comprises a variable capacitance. The second, fifth, eighth and eleventh impedances each comprise a second resistance. The second resistance comprises a variable resistance. The second, fifth, eighth and eleventh impedances each further comprise a capacitance in series with the second resistance. The capacitance comprises a variable capacitance.

In other features, the third, sixth, ninth and twelfth impedances each comprise a third resistance. The third resistance comprises a variable resistance. The first, fourth, seventh and tenth impedances are substantially equal, the second, fifth, eighth and eleventh impedances are substantially equal, and the third, sixth, ninth and twelfth impedances are substantially equal. At least one of the first through twelfth impedances comprises at least one of a variable resistance and a variable capacitance where at least one of the variable resistance and the variable capacitance comprises a switch.

In other features, the switch comprises a metal-oxide semiconductor (MOS) transistor. A frequency response transfer function for the polyphase filter is $$\frac{V_{Iout}}{V_{Iin}} = -\frac{R_2}{R_1}\frac{1+\frac{\omega R_1 C_1}{1+j\omega R_X C_1}}{1+j\omega R_2 C_2}$$

where $V_{Iin}$ represents the first non-inverting input, $V_{Iout}$ represents the first non-inverting output, $R_X C_1$ represents the second impedance, $R_2 C_2$ represent the first impedance, and $R_1$ represents the third impedance.

In other features, a method for operating a polyphase filter comprises coupling a first differential amplifier of the polyphase filter to an impedance network. The first differential amplifier includes first inverting and non-inverting inputs and first inverting and non-inverting outputs. The method also includes coupling the impedance network to a first phase and a shifted first phase of an input signal so that the first inverting and non-inverting inputs communicate with the first phase and the shifted first phase, respectively. The method also includes coupling a second differential amplifier of the polyphase filter to the impedance network. The second differential amplifier includes second inverting and non-inverting inputs and second inverting and non-inverting outputs. The method also includes coupling the impedance network to the second phase and the shifted second phase of the input signal so that the second inverting and non-inverting inputs communicate with the second phase and the shifted second phase, respectively. The second phase is offset from the first phase.

In other features, the first phase of the input signal defines in-phase (I) signals and the shifted first phase of the input signal defines inverse in-phase (−I) signals. The second input phase of the input signal defines quadrature (Q) signals and the shifted second phase of the input signal defines inverse quadrature (−Q) signals.

In other features, the method comprises coupling a first end of a first impedance of the impedance network to the first non-inverting input. The method further includes coupling a second end of the first impedance to the first inverting output. The method further includes coupling a first end of a second impedance of the impedance network to the first non-inverting input. The method further includes coupling a second end of the second impedance to the shifted second phase of the input signal. The method further includes coupling a first end of a third impedance of the impedance network to the first non-inverting input. The method further includes coupling a second end of the third impedance to the first phase of the input signal.

In other features, the method comprises coupling a first end of a fourth impedance of the impedance network to the first inverting input. The method further includes coupling a second end of the fourth impedance to the first non-inverting output. The method further includes coupling a first end of a fifth impedance of the impedance network to the first inverting input. The method further includes coupling a second end of the fifth impedance to the second phase of the input signal. The method further includes coupling a first end of a sixth impedance of the impedance network to the first inverting input. The method further includes coupling a second end of the sixth impedance to the first shifted phase of the input signal.

In other features, the method comprises coupling a first end of a seventh impedance of the impedance network to the second non-inverting input. The method further includes coupling a second end of the seventh impedance to the second inverting output. The method further includes coupling a first end of an eighth impedance of the impedance network to the second non-inverting input. The method further includes coupling a second end of the eighth impedance to the first phase of the input signal. The method further includes coupling a first end of a ninth impedance of the impedance network to the second non-inverting input. The method further includes coupling a second end of the ninth impedance to the second phase of the input signal.

In other features, the method comprises coupling a first end of a tenth impedance of the impedance network to the second inverting input. The method further includes coupling a second end of the tenth impedance to the second non-inverting output. The method further includes coupling a first end of an eleventh impedance of the impedance network to the second inverting input. The method further includes coupling a second end of the eleventh impedance to the shifted first phase of the input signal. The method further includes coupling a first end of a twelfth impedance of the impedance network to the second inverting input. The method further includes coupling a second end of the twelfth impedance that to the shifted second phase of the input signal.

In other features, the first, fourth, seventh and tenth impedances each comprise a first resistance. The first resistance comprises a variable resistance. The first, fourth, seventh and tenth impedances each further comprise a capacitance in parallel with the first resistance. The capacitance comprises a variable capacitance. The second, fifth, eighth and eleventh impedances each comprise a second resistance. The second resistance comprises a variable resistance. The second, fifth, eighth and eleventh impedances each further comprise a capacitance in series with the second resistance. The capacitance comprises a variable capacitance. The third, sixth, ninth and twelfth impedances each comprise a third resistance. The third resistance comprises a variable resistance.

In other features, the first, fourth, seventh and tenth impedances are substantially equal, the second, fifth, eighth and eleventh impedances are substantially equal, and the third, sixth, ninth and twelfth impedances are substantially equal. At least one of the first, through twelfth impedances comprises at least one of a variable resistance and a variable capacitance where at least one of the variable resistance and the variable capacitance comprises a switch. The switch comprises a metal-oxide semiconductor (MOS) transistor.

In other features, the method comprises generating $$\frac{V_{Iout}}{V_{Iin}} = -\frac{R_2}{R_1} \frac{1 + \frac{\omega R_1 C_1}{1 + j\omega R_X C_1}}{1 + j\omega R_2 C_2}$$

as a frequency response transfer function for the polyphase filter. $V_{Iin}$ represents the first non-inverting input, $V_{Iout}$ represents the first non-inverting output, $R_X C_1$ represents the second impedance, $R_2 C_2$ represent the first impedance, and $R_1$ represents the third impedance.

In other features, a polyphase filter comprises impedance network means for filtering. The polyphase filter also comprises first amplifying means for amplifying that includes first inverting and non-inverting inputs and first inverting and non-inverting outputs. The first inverting and non-inverting inputs communicate through the impedance network means with a first phase and a shifted first phase of an input signal, respectively. The polyphase filter also comprises second amplifying means for amplifying that includes second inverting and non-inverting inputs and second inverting and non-inverting outputs. The second inverting and non-inverting inputs communicate with a second phase and a shifted second phase of the input signal, respectively, through the impedance network means. The second phase is offset from the first phase.

In other features, the first phase of the input signal defines in-phase (I) signals and the shifted first phase of the input signal defines inverse in-phase (−I) signals. The second input phase of the input signal defines quadrature (Q) signals and the shifted second phase of the input signal defines inverse quadrature (−Q) signals.

In other features, the impedance network means comprises first impedance means for providing impedance that has a first end and a second end. The first end communicates with the first non-inverting input, and the second end communicates with the first inverting output. The impedance network means also comprises second impedance means for providing impedance that has a first end that communicates with the first non-inverting input and a second end that communicates with the shifted second phase of the input signal. The impedance network means also comprises third impedance means for providing impedance that has a first end that communicates with the first non-inverting input and a second end that communicates with the first phase of the input signal.

In other features, the impedance network means further comprises fourth impedance means for providing impedance that has a first end that communicates with the first inverting input. The fourth impedance means also comprises a second end that communicates with the first non-inverting output. The impedance network means also comprises fifth impedance means for providing impedance that has a first end that communicates with the first inverting input and a second end that communicates with the second phase of the input signal. The impedance network means also comprises sixth impedance means for providing impedance that has a first end communicating with the first inverting input and a second end that communicates with the first shifted phase of the input signal.

In other features, the impedance network comprises seventh impedance means for providing impedance that has a first end that communicates with the second non-inverting input. The seventh impedance means also comprises a second end that communicates with the second inverting output. The impedance network means also comprises eighth impedance means for providing impedance that has a first end that communicates with the second non-inverting input and a second end that communicates with the first phase of the input signal. The impedance network means also comprises ninth impedance means for providing impedance that has a first end that communicates with the second non-inverting input. The ninth impedance means also comprises a second end that communicates with the second phase of the input signal.

In other features, the impedance network comprises tenth impedance means for providing impedance that has a first end that communicates with the second inverting input. The tenth impedance means also comprises a second end that communicates with the second non-inverting output. The impedance network also comprises eleventh impedance means for providing impedance that has a first end that communicates with the second inverting input. The eleventh impedance means also comprises a second end that communicates with the shifted first phase of the input signal. The impedance network means also comprises twelfth impedance means for providing impedance that has a first end that communicates with the second inverting input. The twelfth impedance means also comprises a second end that communicates with the shifted second phase of the input signal.

In other features, the first, fourth, seventh and tenth impedance means each comprise first resistance means for providing resistance. The first resistance means comprises variable resistance means for providing variable resistance. The first, fourth, seventh and tenth impedance means each further comprise capacitance means for providing capacitance in parallel with the first resistance means. The capacitance means comprises variable capacitance means for providing variable capacitance.

In other features, the second, fifth, eighth and eleventh impedance means each comprise second resistance means for providing resistance. The second resistance means comprises variable resistance means for providing resistance. The second, fifth, eighth and eleventh impedance means each further comprise capacitance means for providing capacitance in series with the second resistance means. The capacitance means comprises variable capacitance means for providing variable capacitance.

In other features, the third, sixth, ninth and twelfth impedance means each comprise third resistance means for providing resistance. The third resistance means comprises variable resistance means for providing variable resistance. The first, fourth, seventh and tenth impedance means are substantially equal, the second, fifth, eighth and eleventh impedance means are substantially equal, and the third, sixth, ninth and twelfth impedance means are substantially equal. At least one of the first, through twelfth impedance means comprises at least one of variable resistance means for providing variable resistance and variable capacitance means for providing variable capacitance where at least one of the variable resistance means and the variable capacitance means comprises a switch means for switching. The switch means comprises a metal-oxide semiconductor (MOS) transistor.

In other features, a frequency response transfer function for the polyphase filter is $$\frac{V_{Iout}}{V_{Iin}} = -\frac{R_2}{R_1} \frac{1 + \frac{\omega R_1 C_1}{1 + j\omega R_X C_1}}{1 + j\omega R_2 C_2}$$

where $V_{Iin}$ represents the first non-inverting input, $V_{Iout}$ represents the first non-inverting output, $R_X C_1$ represents the second impedance means, $R_2 C_2$ represent the first impedance means, and $R_1$ represents the third impedance means.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 10C is a functional block diagram of a set top box; and

FIG. 10D is a functional block diagram of a mobile device.

DETAILED DESCRIPTION

Figure 1:
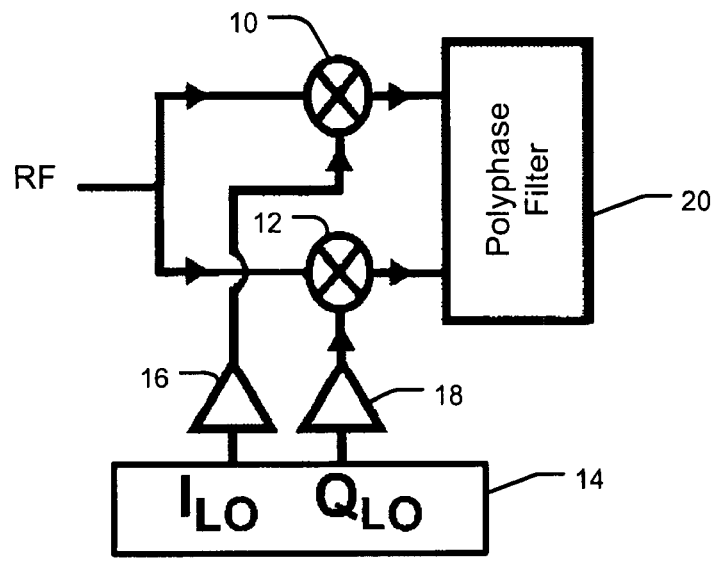
FIG. 1 is a polyphase filter system according to the prior art.
Figure 2A:
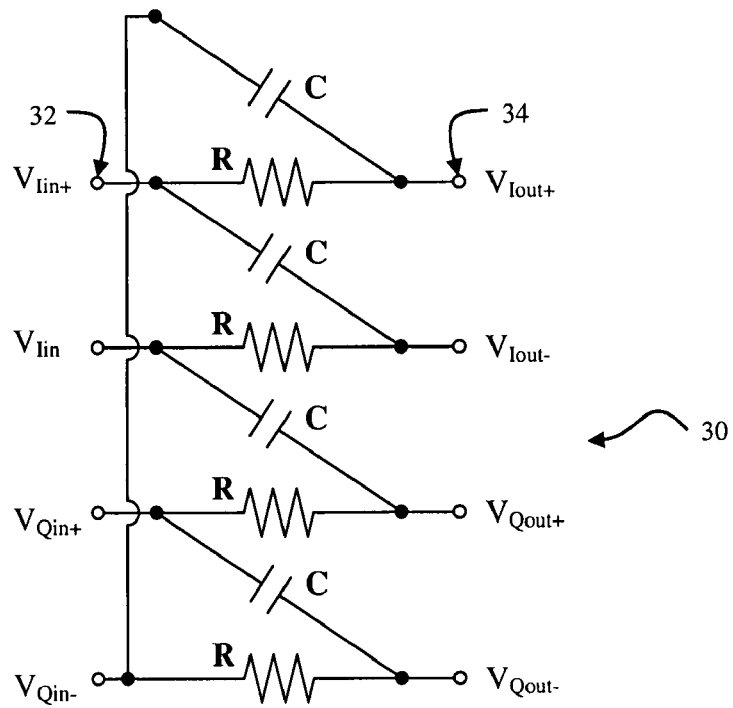
FIG. 2A is a schematic diagram of a passive polyphase filter according to the prior art.
Figure 2B:
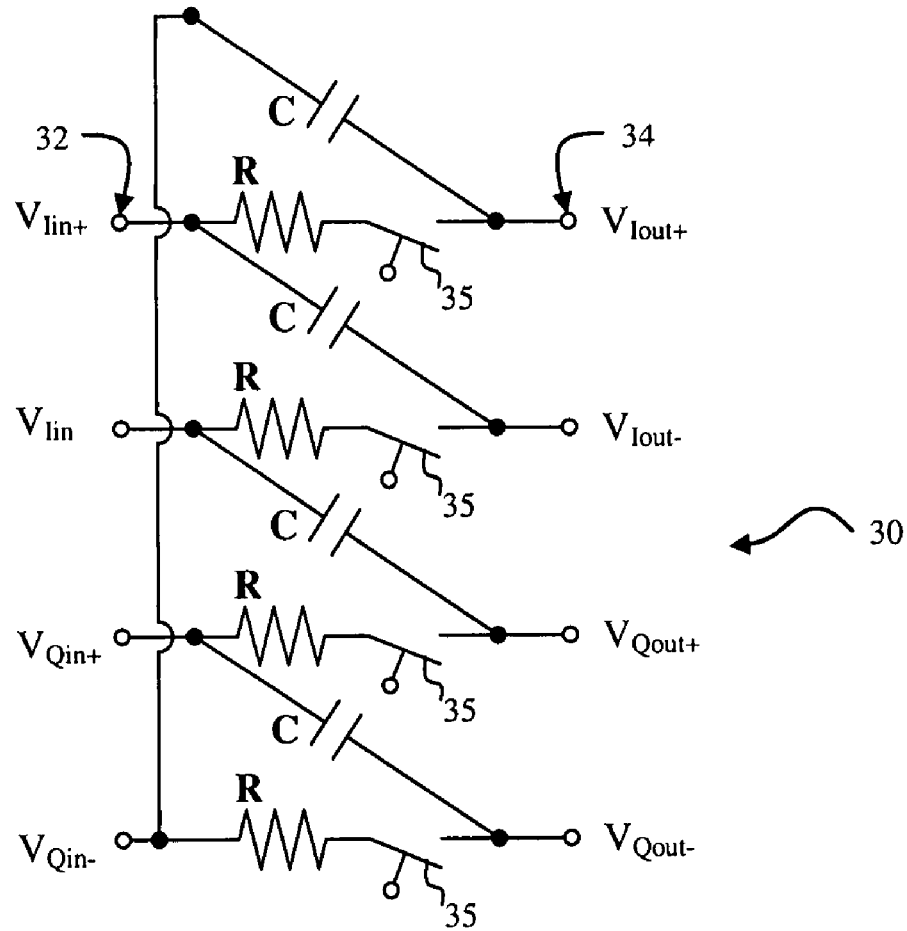
FIG. 2B is a schematic diagram of a passive polyphase filter according to the prior art.
Figure 3:
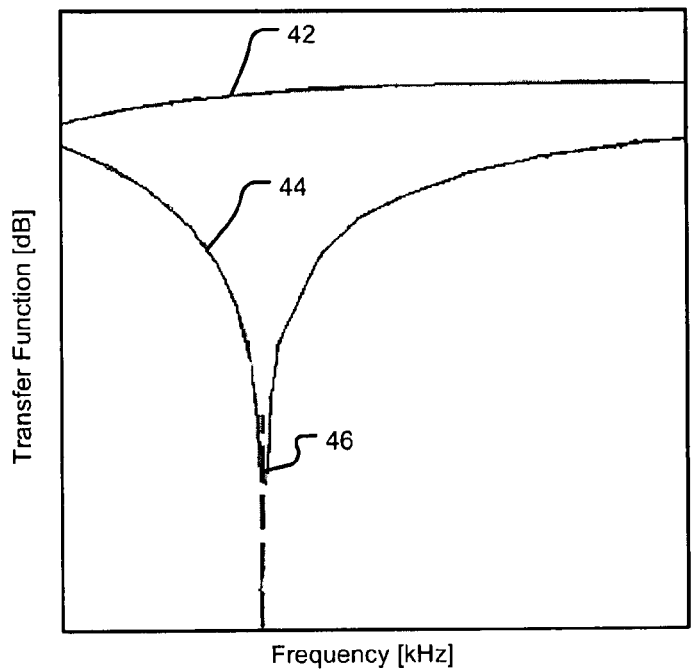
FIG. 3 is a graph of frequency response of a single stage polyphase filter according to the prior art.
Figure 4A:
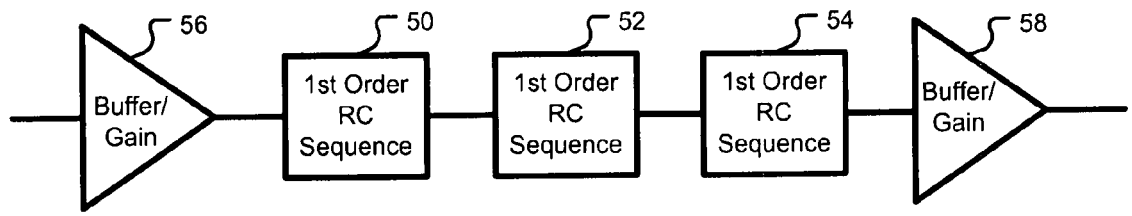
FIG. 4A is a functional block diagram of a cascaded polyphase filter system according to the prior art.
Figure 4B:
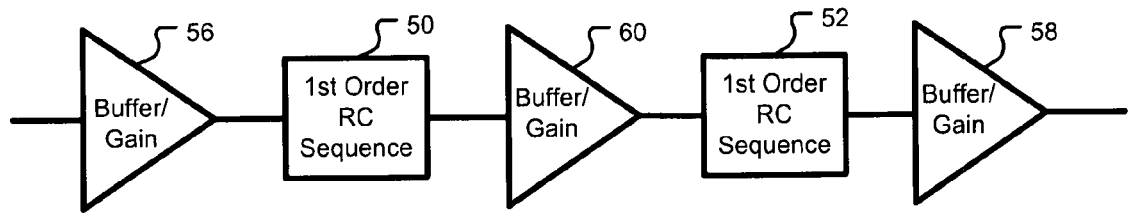
FIG. 4B is a functional block diagram of a cascaded polyphase filter system according to the prior art.
Figure 5:
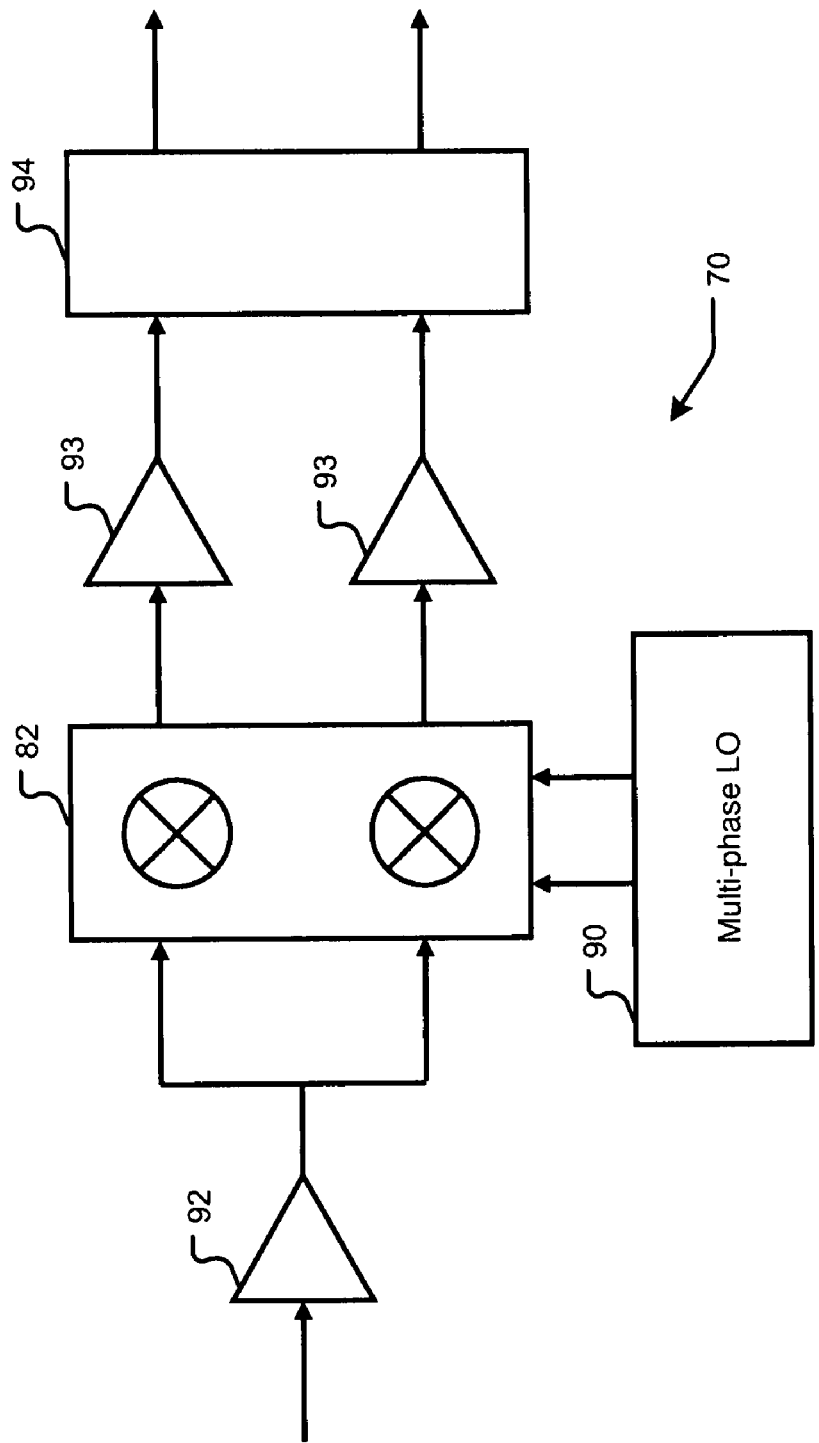
FIG. 5 is a functional block diagram of a receiver system according to the prior art.

The following description is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

Figure 6A:
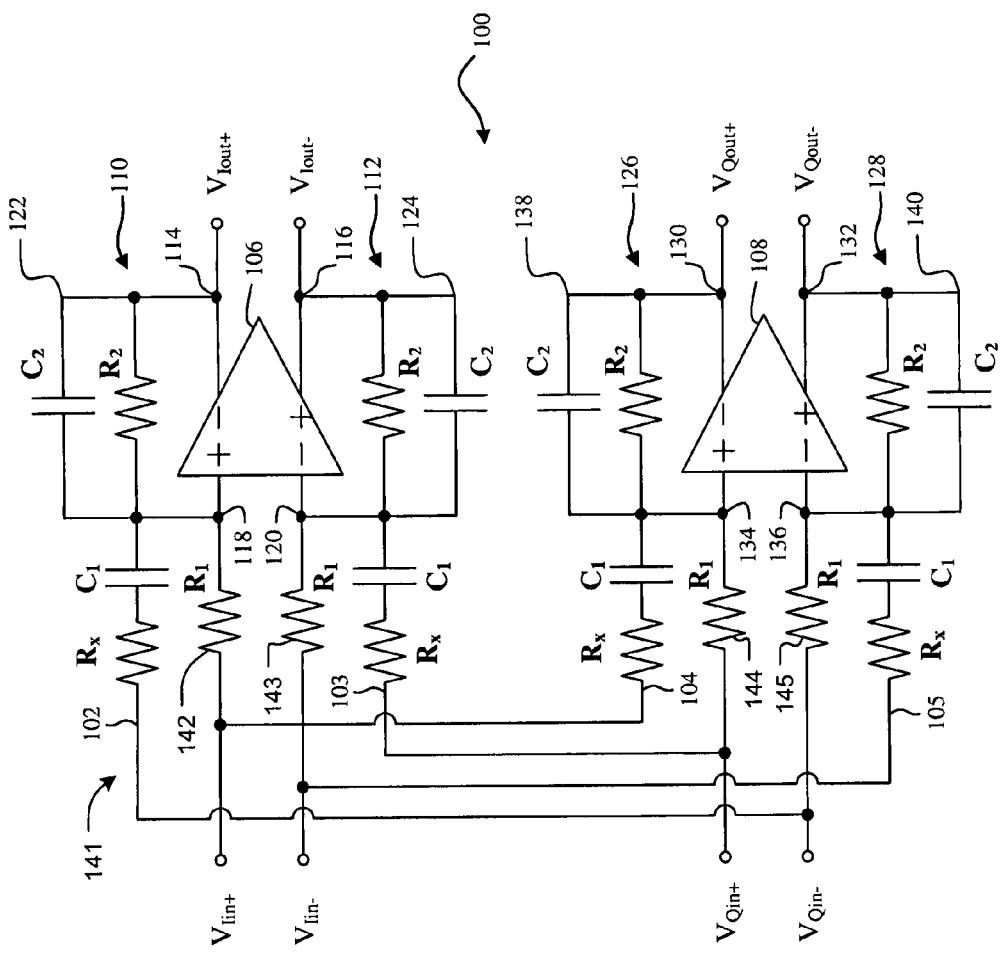
FIG. 6A is a schematic diagram of an active polyphase filter according to the present disclosure.
Figure 6B:
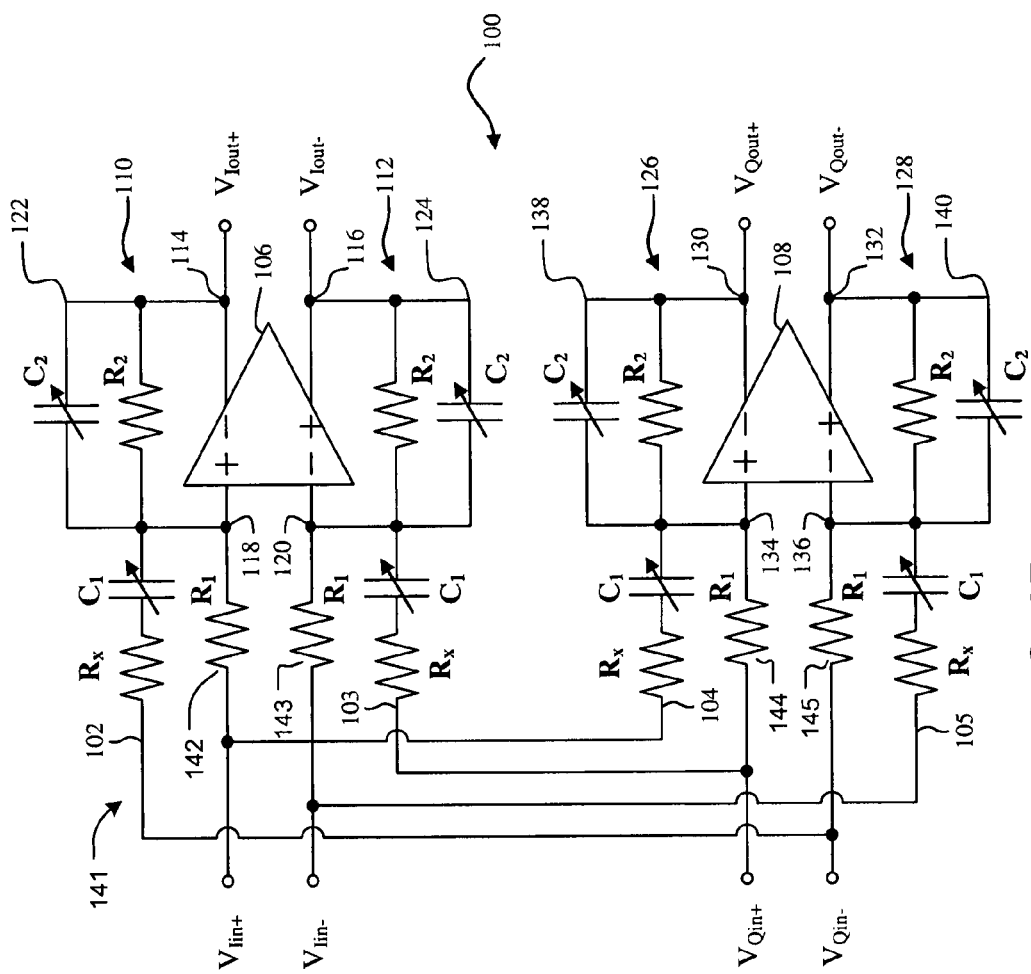
FIG. 6B is a schematic diagram of an active polyphase filter according to the present disclosure.
Figure 6C:
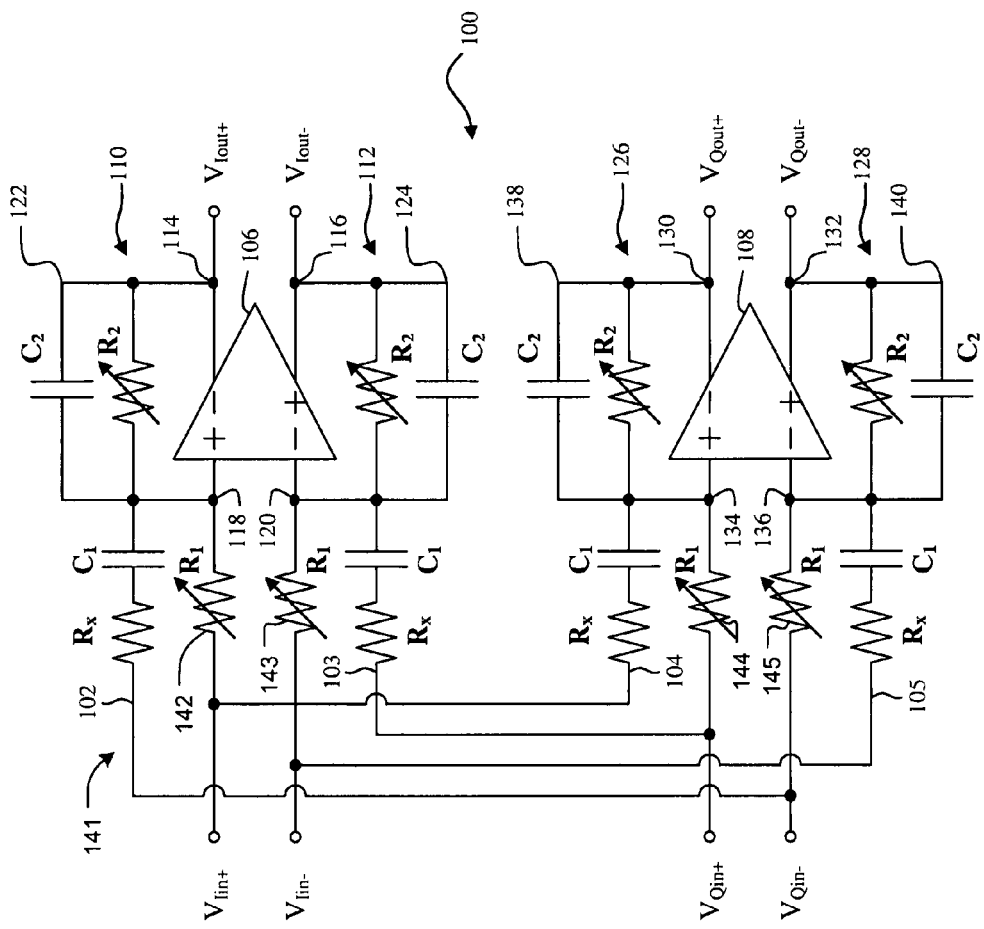
FIG. 6C is a schematic diagram of an active polyphase filter according to the present disclosure.

Referring now to FIGS. 6A, 6B, and 6C, exemplary embodiments of an active polyphase filter 100 are illustrated according to the present disclosure. The polyphase filter 100 may include sets of resistance-capacitance ("RC") circuits 102, 103 and 104, 105 each communicating with a feedback amplifier 106, 108, respectively. The first feedback amplifier 106 may include feedback loops 110, 112, one between each differential output 114, 116 and each respective differential input 118, 120. Each feedback loop 110, 112 may include a parallel RC circuit, 122, 124, respectively. Similarly, the second feedback amplifier 108 includes feedback loops 126, 128, one between each differential output 130, 132 and a respective differential input 134, 136. Each feedback loop 126, 128 includes a parallel RC circuit, 138, 140, respectively. Any of the differential inputs 118, 120, 134, 136 may be considered a virtual ground. The feedback amplifiers may amplify polyphase filter signals and may act as buffers.

The feedback loops 110, 112, 126, 128 may include resistances $R_1$, $R_2$, $R_X$, and capacitances $C_1$, $C_2$ which may be selectively tunable for controlling the polyphase filter output. Parallel RC circuits 122, 124, 138, 140 may include capacitances $C_2$ and resistances $R_2$, which can be, as already mentioned, selectively tunable.

The RC circuits of the polyphase filter 100 may collectively define a cascaded RC configuration or RC/impedance network 141. The RC network 141 may include $R_2C_2$ (for example RC circuit 122) that may represent a first impedance that has ends that communicate with input and output 118, 114 of amplifier 106. $R_XC_1$ (for example RC circuit 102) may be a second impedance of the RC network 141 that has ends that communicate with amplifier inputs 118 and input signal ($V_{Qin}$−). $R_1$ (for example resistance 142) may be a third impedance of the RC network 141 having ends that communicate with amplifier input 118 and a first phase of an input signal ($V_{Iin}$+). A fourth impedance $R_2C_2$ (for example RC circuit 124) of the RC network 141 has ends that communicate with input and output 120, 116 of amplifier 106. A fifth impedance $R_XC_1$ (for example RC circuit 103) of the RC network 141 has ends that communicates with amplifier inputs 120 and a third phase input signal ($V_{Qin}+$). A sixth impedance $R_1$ (for example resistance 143) of the RC network 141 has ends that communicate with amplifier input 120 and a second phase input signal ($V_{lin}-$).

A seventh impedance $R_2C_2$ (for example RC circuit 138) of the RC network 141 has ends that communicate with input and output 134, 130 of amplifier 108. An eighth impedance $R_XC_1$ (for example circuit 104) of the RC network 141 has ends that communicate with amplifier inputs 134 and a first phase input signal ($V_{lin}+$). A ninth impedance $R_1$ (for example resistance 144) of the RC network 141 has ends that communicate with amplifier input 134 and a third phase input signal ($V_{Qin}-$). A tenth impedance $R_2C_2$ (for example RC circuit 140) of the RC network 141 has ends that communicate with input and output 136, 132 of amplifier 108. An eleventh impedance $R_XC_1$ (for example circuit 105) of the RC network 141 has ends that communicate with amplifier inputs 136 and a second phase input signal ($V_{lin}-$). A twelfth impedance $R_1$ (for example resistance 145) of the RC network 141 has ends that communicate with amplifier input 136 and a fourth phase input signal ($V_{Qin}-$).

The active polyphase filter transfer function may be represented by:

$$\frac{V_{Iout}}{V_{lin}} = -\frac{R_2}{R_1} \frac{1 + \frac{\omega R_1 C_1}{1 + j\omega R_x C_1}}{1 + j\omega R_2 C_2} \quad \text{(Equation 2)}$$

When $R_2$ equals $R_1$, $C_2$ equals $C_1$ and $R_x$ equals zero, the transfer function of the active polyphase filter may be similar to:

$$\frac{V_{Iout}}{V_{lin}} = -\frac{1 + \omega R_1 C_1}{1 + j\omega R_1 C_1} \quad \text{(Equation 3)}$$

where the notch is defined at:

$$\omega = -\frac{1}{R_1 C_1}. \quad \text{(Equation 4)}$$

While the ratio $R_2/R_1$ determinates the gain ("G") at frequencies lower than $\omega = \pm 1/(R_1C_1)$, the ratio $C_2/C_1$ sets the gain for higher frequencies. The gain of the polyphase filter may be constant if $R_2=GR_1$ and $C_2=C_1/G$. Varying $R_1$ and $C_1$ may vary position of the notch. Increasing $R_x$ may lower depth of the notch in a frequency response and allow improved rejection of high frequencies.

Referring now to FIGS. 6B-6E, exemplary tunable polyphase filters are illustrated where conventional capacitances and/or resistances may be replaced by tunable devices. In FIG. 6B, capacitances $C_1$ and $C_2$ are tunable devices such as switched capacitances arrays. Switches of capacitances arrays $C_1$ and $C_2$ may be placed in-between the capacitances of the array and the input of the amplifiers. The switches may operate against the virtual ground of the amplifier, thus relaxing its linearity requirements.

Similarly, in FIG. 6C, resistances $R_1$ and $R_2$ are tunable devices such as switched resistances arrays. Switches of resistances arrays $R_1$ and $R_2$ may be placed in-between the resistances of the array and the input of the amplifiers. The switch may operate against the virtual ground of the amplifier, thus relaxing its linearity requirements.

Figure 6D:
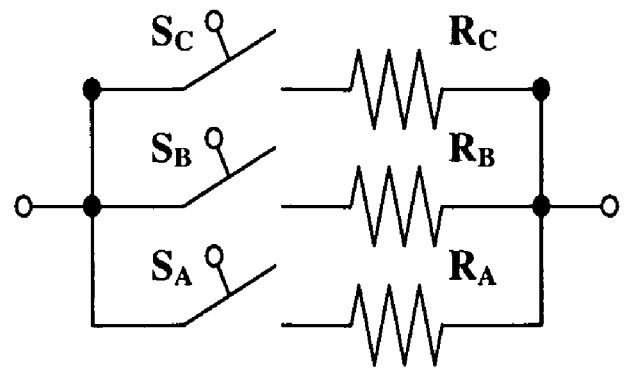
FIG. 6D is a schematic diagram of a switching resistance array for an active polyphase filter according to the present disclosure.
Figure 6E:
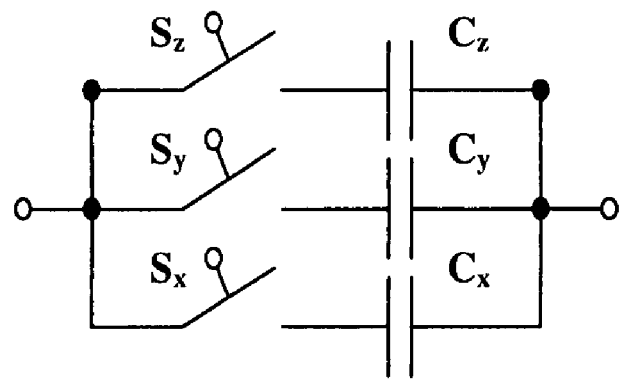
FIG. 6E is a schematic diagram of a switching capacitance array for an active polyphase filter according to the present disclosure.

In FIG. 6D, tunable resistances may be realized with switched arrays of resistances including switches $S_A$, $S_B$, $S_C$ and resistances $R_A$, $R_B$, $R_C$ as illustrated. In FIG. 6E, tunable capacitances may be realized with switched arrays of capacitances including switches $S_x$, $S_y$, $S_z$ and capacitances $C_x$, $C_y$, $C_z$ as illustrated. The arrays may include numerous numbers of capacitances and resistances. Switches may include metal-oxide semiconductor (MOS) transistors, and/or other switching devices.

Active polyphase filters may be used in a cascaded configuration of two or more stages where the four outputs of a first stage ($V_{Iout}+$, $V_{Qout}+$, $V_{Iout}-$, $V_{Qout}-$) may be connected to the four inputs ($V_{lin}+$, $V_{Qin}+$, $V_{lin}-$, $V_{Qin}-$) of the following stage. The frequency response of each individual stage may be either similar or different such that the overall frequency response may have superimposed and deeper notches or different notch frequencies. The gain and the rejection of high frequencies may also be different for each individual stage.

Figure 7A:
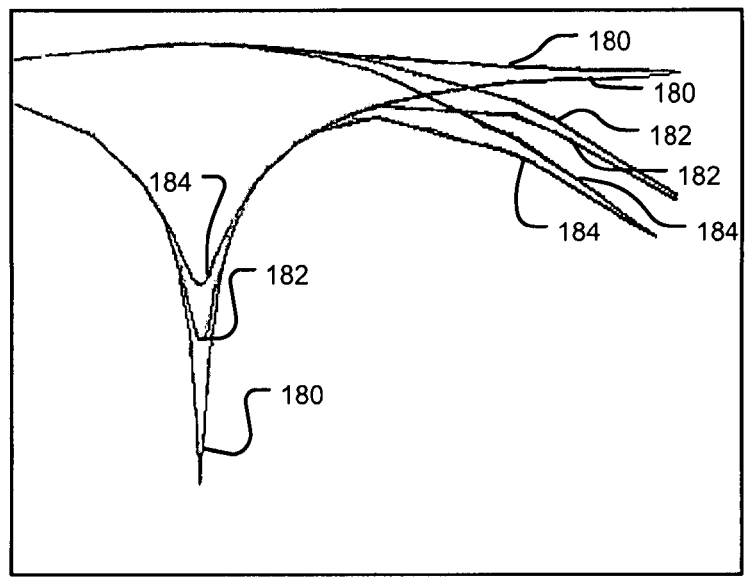
FIG. 7A is a graph of a frequency response for an active polyphase filter according to the present disclosure.
Figure 7B:
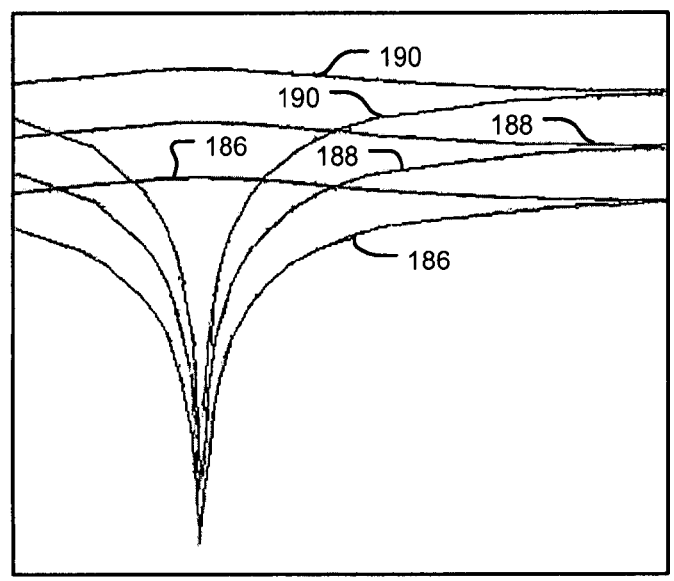
FIG. 7B is a graph of a frequency response for an active polyphase filter according to the present disclosure.

Referring now to FIGS. 7A and 7B, the frequency response for the polyphase filter is illustrated. In FIG. 7A, $R_X$ may be varied for exemplary values 0, 800, and 1.5 k Ohms, corresponding to graphs 180, 182, 184, respectively, showing various depths of the notch and various attenuations of high frequencies. In FIG. 7B, $R_2$ and $C_2$ may be varied to get exemplary gain values, 1, 2, and 4, corresponding to graphs 186, 188, 190, respectively.

Figure 7C:
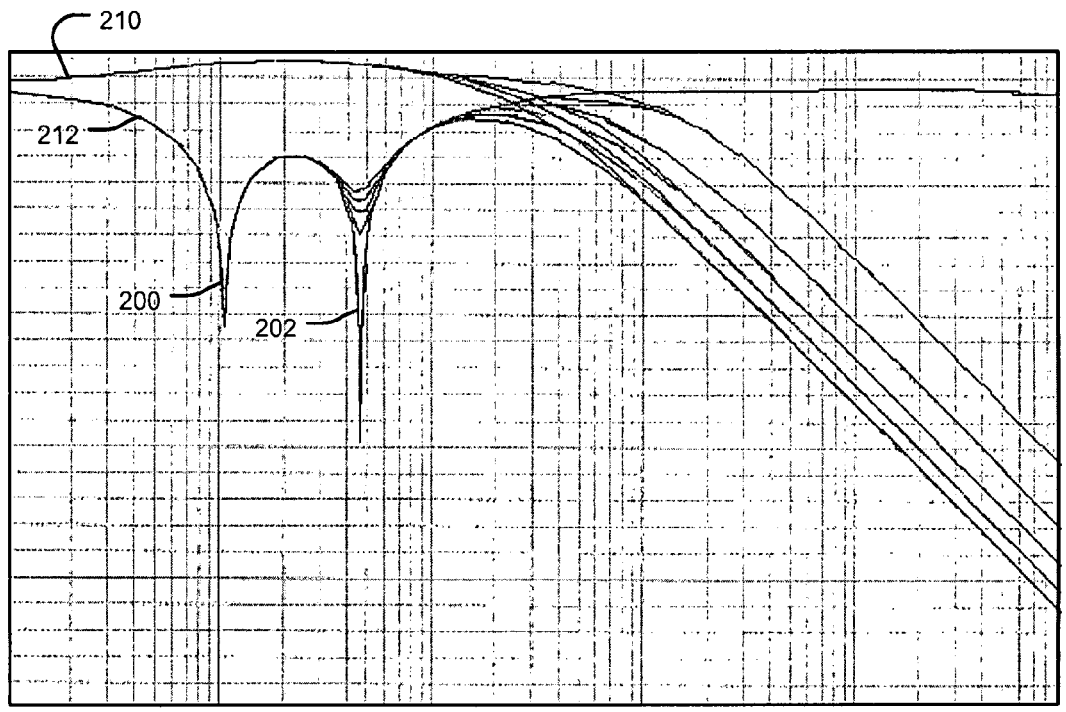
FIG. 7C is a graph of a frequency response for an active polyphase filter according to the present disclosure.

Referring now to FIG. 7C, the overall frequency response of two cascaded polyphase filters is illustrated. Two notches 200, 202 are defined as a result of the two RC sequences with similarly varied values as in FIG. 7A. Graphs 210 represent the characteristics when desired signals are input, and graphs 212 represent the characteristics when image signals are input. A difference between the characteristics of the graphs 210, 212 illustrates image rejection.

Figure 8:
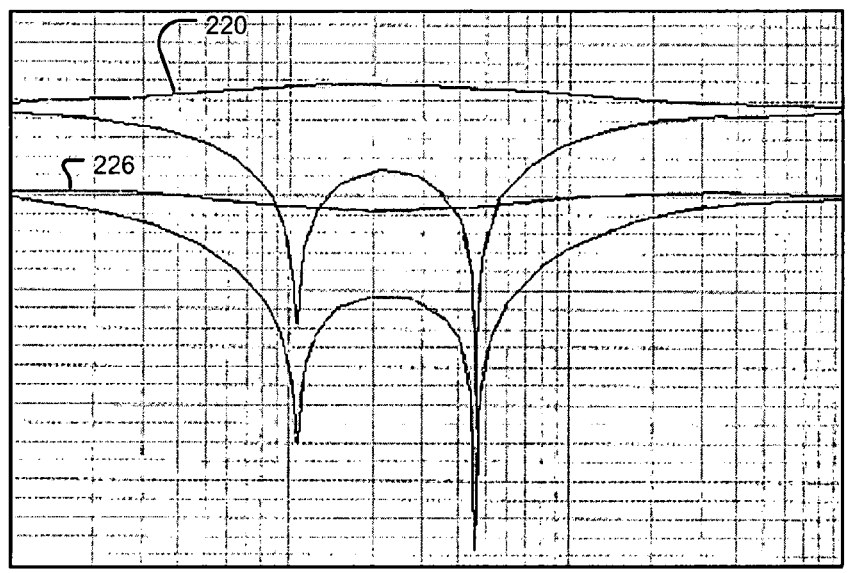
FIG. 8 is a comparison graph of a frequency response for an active polyphase filter according to the present disclosure and a frequency response for a passive polyphase filter.

Referring now to FIG. 8, a frequency response 220 of two cascaded active polyphase filters according to the present disclosure and a frequency response 226 of two cascaded passive polyphase filters according to the prior art are illustrated. The image rejection may be similar, but the frequency response may differ as the active polyphase filter may include an intrinsic gain.

Figure 9:
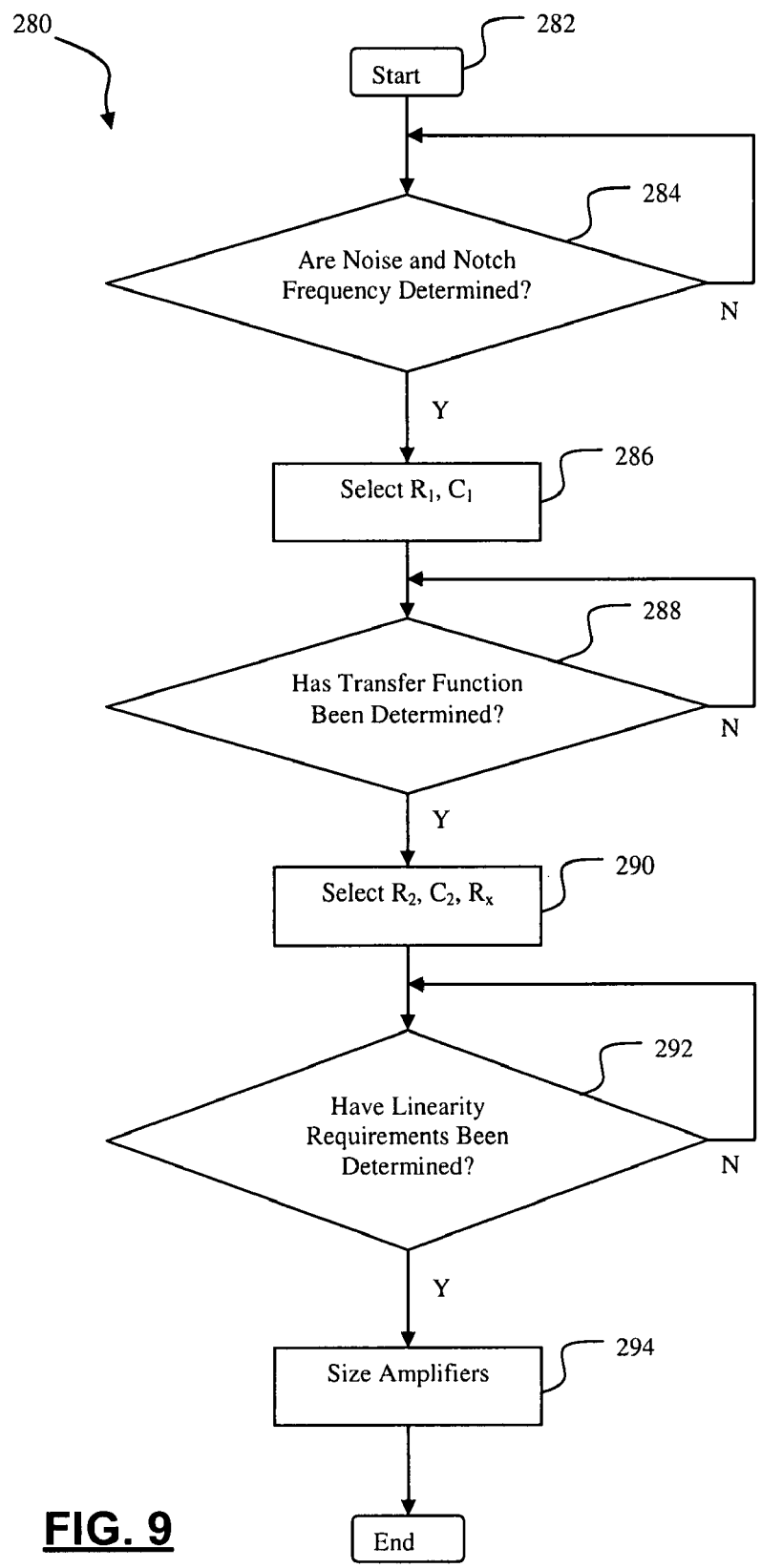
FIG. 9 is a flowchart of an exemplary active polyphase filter operational method according to the present disclosure.

Referring now to FIG. 9, an exemplary flowchart 280 of a method for optimizing the polyphase filter is illustrated. Control starts in step 282. In step 284, if notch frequency and noise requirements for the filter are determined, $R_1$ and $C_1$ may be selected based on the notch frequency and noise requirements in step 286. In step 288, if the transfer function for the filter has been determined, $R_2$, $C_2$, and $R_X$ may be selected based on the transfer function in step 290. In step 292, if linearity requirements have been determined for the polyphase filter, an appropriate sizing of the amplifier (including bandwidth) is selected based on linearity requirements in step 294.

Figure 10B:
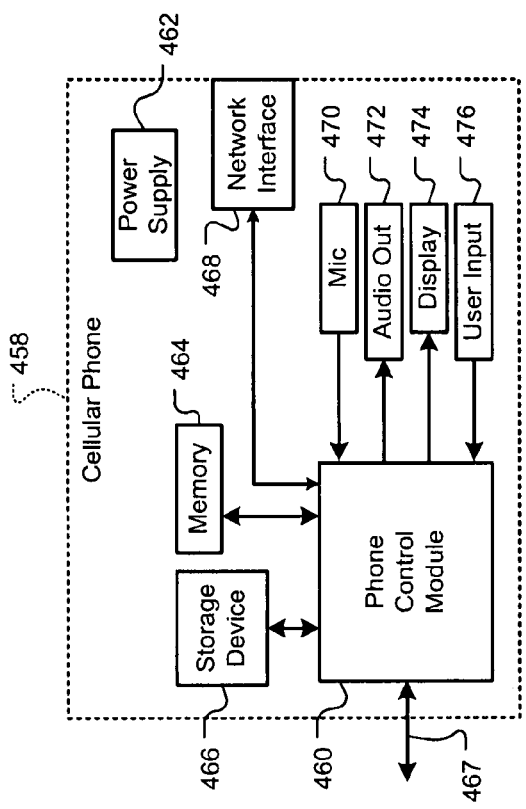
FIG. 10B is a functional block diagram of a cellular phone.
Figure 10A:
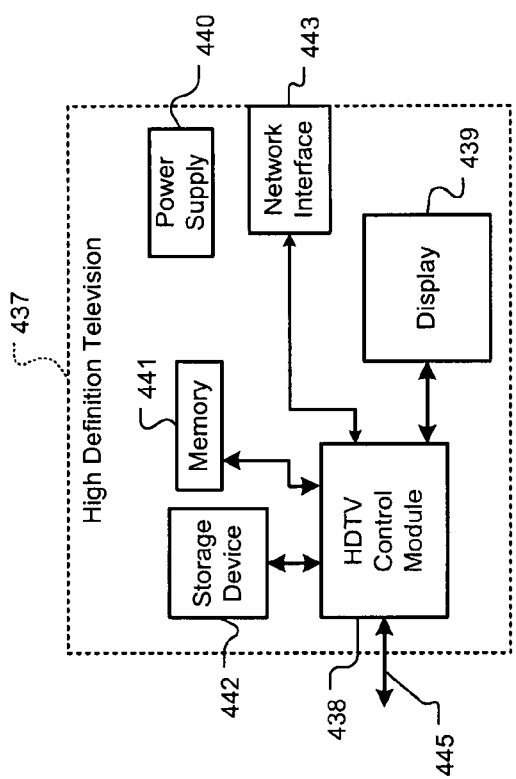
FIG. 10A is a functional block diagram of a high definition television.

Referring now to FIGS. 10A-10D, various exemplary implementations of the polyphase filter are shown. Referring now to FIG. 10A, a high definition television (HDTV) 437 may implement the polyphase filter in a network interface. The HDTV 437 includes a HDTV control module 438, a display 439, a power supply 440, memory 441, a storage device 442, the network interface 443, and an external interface 445. If the network interface 443 includes a wireless local area network interface, an antenna (not shown) may be included.

The HDTV 437 can receive input signals from the network interface 443 and/or the external interface 445, which can send and receive information via cable, broadband Internet, and/or satellite. The HDTV control module 438 may process the input signals, including encoding, decoding, filtering, and/or formatting, and generate output signals. The output signals may be communicated to one or more of the display 439, memory 441, the storage device 442, the network interface 443, and the external interface 445.

Memory 441 may include random access memory (RAM) and/or nonvolatile memory such as flash memory, phase change memory, or multi-state memory, in which each memory cell has more than two states. The storage device 442 may include an optical storage drive, such as a DVD drive, and/or a hard disk drive (HDD). The HDTV control module 438 communicates externally via the network interface 443 and/or the external interface 445. The power supply 440 provides power to the components of the HDTV 437.

Referring now to FIG. 10B, the teachings of the disclosure can be implemented in a network interface of a cellular phone 458. The cellular phone 458 includes a phone control module 460, a power supply 462, memory 464, a storage device 466, and a cellular network interface 467. The cellular phone 458 may include the network interface 468, a microphone 470, an audio output 472 such as a speaker and/or output jack, a display 474, and a user input device 476 such as a keypad and/or pointing device. If the network interface 468 includes a wireless local area network interface, an antenna (not shown) may be included.

The phone control module 460 may receive input signals from the cellular network interface 467, the network interface 468, the microphone 470, and/or the user input device 476. The phone control module 460 may process signals, including encoding, decoding, filtering, and/or formatting, and generate output signals. The output signals may be communicated to one or more of memory 464, the storage device 466, the cellular network interface 467, the network interface 468, and the audio output 472.

Memory 464 may include random access memory (RAM) and/or nonvolatile memory such as flash memory, phase change memory, or multi-state memory, in which each memory cell has more than two states. The storage device 466 may include an optical storage drive, such as a DVD drive, and/or a hard disk drive (HDD). The power supply 462 provides power to the components of the cellular phone 458.

Referring now to FIG. 10C, the teachings of the disclosure can be implemented in a network interface of a set top box 478. The set top box 478 includes a set top control module 480, a display 481, a power supply 482, memory 483, a storage device 484, and the network interface 485. If the network interface 485 includes a wireless local area network interface, an antenna (not shown) may be included.

The set top control module 480 may receive input signals from the network interface 485 and an external interface 487, which can send and receive information via cable, broadband Internet, and/or satellite. The set top control module 480 may process signals, including encoding, decoding, filtering, and/or formatting, and generate output signals. The output signals may include audio and/or video signals in standard and/or high definition formats. The output signals may be communicated to the network interface 485 and/or to the display 481. The display 481 may include a television, a projector, and/or a monitor.

The power supply 482 provides power to the components of the set top box 478. Memory 483 may include random access memory (RAM) and/or nonvolatile memory such as flash memory, phase change memory, or multi-state memory, in which each memory cell has more than two states. The storage device 484 may include an optical storage drive, such as a DVD drive, and/or a hard disk drive (HDD).

Referring now to FIG. 10D, the teachings of the disclosure can be implemented in a network interface of a mobile device 489. The mobile device 489 may include a mobile device control module 490, a power supply 491, memory 492, a storage device 493, the network interface 494, and an external interface 499. If the network interface 494 includes a wireless local area network interface, an antenna (not shown) may be included.

The mobile device control module 490 may receive input signals from the network interface 494 and/or the external interface 499. The external interface 499 may include USB, infrared, and/or Ethernet. The input signals may include compressed audio and/or video, and may be compliant with the MP3 format. Additionally, the mobile device control module 490 may receive input from a user input 496 such as a keypad, touchpad, or individual buttons. The mobile device control module 490 may process input signals, including encoding, decoding, filtering, and/or formatting, and generate output signals.

The mobile device control module 490 may output audio signals to an audio output 497 and video signals to a display 498. The audio output 497 may include a speaker and/or an output jack. The display 498 may present a graphical user interface, which may include menus, icons, etc. The power supply 491 provides power to the components of the mobile device 489. Memory 492 may include random access memory (RAM) and/or nonvolatile memory such as flash memory, phase change memory, or multi-state memory, in which each memory cell has more than two states. The storage device 493 may include an optical storage drive, such as a DVD drive, and/or a hard disk drive (HDD). The mobile device may include a personal digital assistant, a media player, a laptop computer, a gaming console, or other mobile computing device.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A polyphase filter comprising:
   a first input configured to receive a first signal, the first signal having a first phase;
   a second input configured to receive a second signal, the second signal having a second phase;
   a third input configured to receive a third signal, the third signal having a third phase;
   a fourth input configured to receive a fourth signal, the fourth signal having a fourth phase;
   an impedance network;
   a first differential amplifier including
      a first non-inverting input and a first inverting input, wherein the first non-inverting input is in communication with the first input of the polyphase filter via the impedance network, and wherein the first inverting input is in communication with the second input of the polyphase filter via the impedance network,
      a first inverting output and a first non-inverting output;
   a second differential amplifier including
      a second non-inverting input and a second inverting input, wherein the second non-inverting input is in communication with the third input of the polyphase filter via the impedance network, and wherein the second inverting input is in communication with the fourth input of the polyphase filter via the impedance network,
a second inverting output and a second non-inverting output; and
a first resistance and a first capacitance with (i) a first end directly connected to the first non-inverting input and (ii) a second end directly connected to the fourth input of the polyphase filter.

2. The polyphase filter of claim 1, wherein:
the first signal is an in-phase (I) signal; and
the second signal is an inverse in-phase (−I) signal.

3. The polyphase filter of claim 1, wherein:
the third signal is a quadrature (Q) signal; and
the fourth signal is an inverse quadrature (−Q) signal.

4. The polyphase filter of claim 1, wherein the impedance network comprises:
a first impedance with (i) a first end in communication with the first non-inverting input and (ii) a second end in communication with the first inverting output;
a second impedance including (i) the first resistance, (ii) the first capacitance, (iii) a first end in communication with the first non-inverting input, and a second end in communication with the fourth signal; and
a third impedance with (i) a first end in communication with the first non-inverting input and (ii) a second end in communication with the first signal.

5. The polyphase filter of claim 4, wherein the impedance network further comprises:
a fourth impedance with (i) a first end in communication with the first inverting input and (ii) a second end in communication with the first non-inverting output;
a fifth impedance with (i) a first end in communication with the first inverting input and (ii) a second end in communication with the third signal; and
a sixth impedance with (I) a first end in communication with the first inverting input and (ii) a second end in communication with the second signal.

6. The polyphase filter of claim 5, wherein the impedance network further comprises:
a seventh impedance with (i) a first end in communication with the second non-inverting input and (ii) a second end in communication with the second inverting output;
an eighth impedance with (i) a first end in communication with the second non-inverting input and (ii) a second end in communication with the first signal; and
a ninth impedance with (i) a first end in communication with the second non-inverting input and (ii) a second end in communication with the third signal.

7. The polyphase filter of claim 6, wherein the impedance network further comprises:
a tenth impedance with (i) a first end in communication with the second inverting input and (ii) a second end in communication with the second non-inverting output;
an eleventh impedance with (i) a first end in communication with the second inverting input and (ii) a second end in communication with the second signal; and
a twelfth impedance with (i) a first end in communication with the second inverting input and (ii) a second end in communication with the fourth signal.

8. The polyphase filter of claim 7, wherein each of the first impedance, the fourth impedance, the seventh impedance, and the tenth impedance comprise a resistance.

9. The polyphase filter of claim 8, wherein the resistances of the first impedance, the fourth impedance, the seventh impedance, and the tenth impedance are variable resistances.

10. The polyphase filter of claim 8, wherein each of the first impedance, the fourth impedance, the seventh impedance, and the tenth impedance further comprise a capacitance in parallel with a respective one of the resistances of the first impedance, the fourth impedance, the seventh impedance, and the tenth impedance.

11. The polyphase filter of claim 10, wherein capacitances of the first impedance, the fourth impedance, the seventh impedance, and the tenth impedance are variable capacitances.

12. The polyphase filter of claim 10, wherein:
the second impedance comprises the first resistance;
the first resistance has a first resistance value; and
each of the fifth impedance, the eighth impedance, and the eleventh impedance comprise a resistance with a second resistance value equal to the first resistance value.

13. The polyphase filter of claim 12, wherein the first resistance and the resistances of the fifth impedance, the eighth impedance, and the eleventh impedance are variable resistances.

14. The polyphase filter of claim 12, wherein:
the second impedance includes the first capacitance in series with the first resistance; and
each of the fifth impedance, the eighth impedance, and the eleventh impedance further comprise a capacitance in series with the resistances of the fifth impedance, the eighth impedance and the eleventh impedance.

15. The polyphase filter of claim 14, wherein the first capacitance and the capacitances of the fifth impedance, the eighth impedance, and the eleventh impedance are variable capacitances.

16. The polyphase filter of claim 14, wherein each of the third impedance, the sixth impedance, the ninth impedance, and the twelfth impedance comprise a resistance.

17. The polyphase filter of claim 16, wherein the resistances of the third impedance, the sixth impedance, the ninth impedance, and the twelfth impedance are variable resistances.

18. The polyphase filter of claim 16, wherein:
impedance values of the first impedance, the fourth impedance, the seventh impedance, and the tenth impedance are equal to each other;
impedance values of the second impedance, the fifth impedance, the eighth impedance, and the eleventh impedance are equal to each other; and
impedance values of the third impedance, the sixth impedance, the ninth impedance, and the twelfth impedance are equal to each other.

19. The polyphase filter of claim 16, wherein:
at least one of the first impedance, the second impedance, the third impedance, the fourth impedance, the fifth impedance, the sixth impedance, the seventh impedance, the eighth impedance, the ninth impedance, the tenth impedance, the eleventh impedance, or the twelfth impedance comprise at least one of a variable resistance or a variable capacitance; and
at least one of the variable resistance or the variable capacitance comprises a switch.

20. The polyphase filter of claim 19, wherein the switch comprises a metal-oxide semiconductor (MOS) transistor.

21. The polyphase filter of claim 16, wherein a frequency response transfer function for the polyphase filter is $$\frac{V_{Iout}}{V_{Iin}} = -\frac{R_2}{R_1} \frac{1 + \frac{\omega R_1 C_1}{1 + j\omega R_X C_1}}{1 + j\omega R_2 C_2},$$

where $V_{Iin}$ is a voltage at the first non-inverting input, $V_{Iout}$ is a voltage at the first non-inverting output, $R_X C_1$ is the second impedance, $R_2 C_2$ is the first impedance, and $R_1$ is the third impedance.

22. The polyphase filter of claim 1, wherein:
the first signal and the second signal are in-phase signals;
the third signal and the fourth signal are quadrature signals;
the first signal is phase offset from the third signal; and
the second signal is phase offset from the fourth signal.

23. The polyphase filter of claim 1, further comprising at least one of a second resistance and a second capacitance with (i) a first end in communication with the first inverting input and (ii) a second end in communication with the third input of the polyphase filter.

24. A method for operating a polyphase filter, the method comprising:
coupling a first differential amplifier of the polyphase filter to an impedance network, wherein the first differential amplifier includes a first non-inverting input, a first inverting input, a first inverting output and a first non-inverting output;
coupling the impedance network to (i) a first input of the polyphase filter and (ii) a second input of the polyphase filter, wherein the first input of the polyphase filter is configured to receive a first input signal with a first phase, and wherein the second input of the polyphase filter is configured to receive a second input signal with a second phase;
providing the first input signal to the first non-inverting input via the impedance network;
providing the second input signal to the first inverting input via the impedance network;
coupling a second differential amplifier of the polyphase filter to the impedance network, wherein the second differential amplifier includes a second non-inverting input, a second inverting input, a second inverting output, and a non-inverting output;
coupling the impedance network to (i) a third input of the polyphase filter and (ii) a fourth input of the polyphase filter, wherein the third input of the polyphase filter is configured to receive a third input signal with a third phase, and wherein the fourth input of the polyphase filter is configured to receive a fourth input signal with a fourth phase;
providing the third input signal to the second non-inverting input via the impedance network;
providing the fourth input signal to the second inverting input via the impedance network, wherein (i) the first phase and the second phase are offset from (ii) the third phase and the fourth phase;
coupling (i) a first end of a first resistance directly to the first non-inverting input and (ii) a second end of the first resistance directly to a first end of a first capacitance; and
coupling a second end of the first capacitance directly to the fourth input of the polyphase filter.

25. The method of claim 24, wherein:
the first input signal is an in-phase (I) signal; and
the second input signal is an inverse in-phase (−I) signal.

26. The method of claim 24, wherein:
the third input signal is a quadrature (Q) signal; and
the fourth input signal is an inverse quadrature (−Q) signal.

27. The method of claim 24, further comprising:
coupling a first end of a first impedance of the impedance network to the first non-inverting input;
coupling a second end of the first impedance to the first inverting output;
coupling a first end of a second impedance of the impedance network to the first non-inverting input, wherein the second impedance includes the first resistance and the first capacitance;
providing the fourth input signal to a second end of the second impedance;
coupling a first end of a third impedance of the impedance network to the first non-inverting input; and
providing the first input signal to a second end of the third impedance.

28. The method of claim 27, further comprising:
coupling a first end of a fourth impedance of the impedance network to the first inverting input;
coupling a second end of the fourth impedance to the first non-inverting output;
coupling a first end of a fifth impedance of the impedance network to the first inverting input;
providing the third input signal to a second end of the fifth impedance;
coupling a first end of a sixth impedance of the impedance network to the first inverting input; and
providing the second input signal to a second end of the sixth impedance.

29. The method of claim 28, further comprising:
coupling a first end of a seventh impedance of the impedance network to the second non-inverting input;
coupling a second end of the seventh impedance to the second inverting output;
coupling a first end of an eighth impedance of the impedance network to the second non-inverting input;
providing the first input signal to a second end of the eighth impedance;
coupling a first end of a ninth impedance of the impedance network to the second non-inverting input; and
providing the third input signal to a second end of the ninth impedance.

30. The method of claim 29, further comprising:
coupling a first end of a tenth impedance of the impedance network to the second inverting input;
coupling a second end of the tenth impedance to the second non-inverting output;
coupling a first end of an eleventh impedance of the impedance network to the second inverting input;
providing the second input signal to a second end of the eleventh impedance;
coupling a first end of a twelfth impedance of the impedance network to the second inverting input; and
providing the fourth input signal to a second end of the twelfth impedance.

31. The method of claim 30, wherein each of the first impedance, the fourth impedance, the seventh impedance, and the tenth impedance comprise a resistance.

32. The method of claim 31, wherein the resistances of the first impedance, the fourth impedance, the seventh impedance, and the tenth impedance are variable resistances.

33. The method of claim 31, wherein each of the first impedance, the fourth impedance, the seventh impedance, and the tenth impedance further comprise a capacitance in parallel with a respective one of the resistances of the first impedance, the fourth impedance, the seventh impedance and the tenth impedance.

34. The method of claim 33, wherein the capacitances of the first impedance, the fourth impedance, the seventh impedance, and the tenth impedance are variable capacitances.

35. The method of claim 33, wherein:
the second impedance comprises the first resistance;
the first resistance has a first resistance value; and
each of the fifth impedance, the eighth impedance, and the eleventh impedance comprise a resistance with a second resistance value equal to the first resistance value.

36. The method of claim 35, wherein the first resistance and the resistances of the fifth impedance, the eighth impedance, and the eleventh impedance are variable resistances.

37. The method of claim 36, wherein:
the second impedance includes the first capacitance in series with the first resistance; and
each of the fifth impedance, the eighth impedance, and the eleventh impedance further comprise a capacitance in series with the resistances of the fifth impedance, the eighth impedance, and the eleventh impedance.

38. The method of claim 37, wherein the first capacitance and the capacitances of the fifth impedance, the eighth impedance, and the eleventh impedance are variable capacitances.

39. The method of claim 37, wherein each of the third impedance, the sixth impedance, the ninth impedance, and the twelfth impedance comprise a resistance.

40. The method of claim 39, wherein the resistances of the third impedance, the sixth impedance, the ninth impedance, and the twelfth impedance are variable resistances.

41. The method of claim 39, wherein:
impedance values of the first impedance, the fourth impedance, the seventh impedance, and the tenth impedance are equal to each other,
impedance values of the second impedance, the fifth impedance, the eighth impedance, and the eleventh impedance are equal to each other, and
impedance values of the third impedance, the sixth impedance, the ninth impedance, and the twelfth impedance are equal to each other.

42. The method of claim 39, wherein:
at least one of the first impedance, the second impedance, the third impedance, the fourth impedance, the fifth impedance, the sixth impedance, the seventh impedance, the eighth impedance, the ninth impedance, the tenth impedance, the eleventh impedance, or the twelfth impedance comprises at least one of a variable resistance or a variable capacitance; and
at least one of the variable resistance or the variable capacitance comprises a switch.

43. The method of claim 42, wherein the switch comprises a metal-oxide semiconductor (MOS) transistor.

44. The method of claim 39, further comprising generating $$\frac{V_{Iout}}{V_{Iin}} = -\frac{R_2}{R_1} \frac{1 + \frac{\omega R_1 C_1}{1 + j\omega R_X C_1}}{1 + j\omega R_2 C_2}$$

as a frequency response transfer function for the polyphase filter, where $V_{Iin}$ is a voltage at the first non-inverting input, $V_{Iout}$ is a voltage at the first non-inverting output, $R_X C_1$ is the second impedance, $R_2 C_2$ is the first impedance, and $R_1$ is the third impedance.

45. A polyphase filter comprising:
a first input configured to receive a first signal, the first signal having a first phase;
a second input configured to receive a second input signal, the second signal having a second phase;
a third input configured to receive a third signal, the third signal having a third phase;
a fourth input configured to receive a fourth signal, the fourth signal having a fourth phase;
an impedance network;
a first differential amplifier including
a first non-inverting input and a first inverting input, wherein the first non-inverting input is in communication with the first input of the polyphase filter via the impedance network, and wherein the first inverting input is in communication with the second input of the polyphase filter via the impedance network,
a first inverting output and a first non-inverting output;
a second differential amplifier including
a second non-inverting input and a second inverting input, wherein the second non-inverting input is in communication with the third input of the polyphase filter via the impedance network, and wherein the second inverting input is in communication with the fourth input via the impedance network,
a second inverting output and a second non-inverting output; and
at least one of
a first resistance with (i) a first end directly connected to one of the first non-inverting input and the first inverting input via a first capacitance and (ii) a second end directly connected to one of the third input of the polyphase filter and the fourth input of the polyphase filter, or
a second resistance with (i) a first end directly connected to one of the second non-inverting input and the second inverting input via a second capacitance and (ii) a second end directly connected to one of the first input of the polyphase filter and the second input of the polyphase filter.

* * * * *